(12) United States Patent
Park et al.

(10) Patent No.: US 8,937,459 B2
(45) Date of Patent: Jan. 20, 2015

(54) APPARATUS AND METHOD FOR ESTIMATING STATE OF HEALTH OF BATTERY

(71) Applicant: LG Chem, Ltd., Seoul (KR)

(72) Inventors: Kyu-Ha Park, Seoul (KR); Cheol-Taek Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 14/017,978

(22) Filed: Sep. 4, 2013

(65) Prior Publication Data

US 2014/0009123 A1 Jan. 9, 2014

Related U.S. Application Data

(63) Continuation of application No. PCT/KR2012/000083, filed on Jan. 4, 2012.

(30) Foreign Application Priority Data

Apr. 25, 2011 (KR) .................. 10-2011-0038545
Jan. 4, 2012 (KR) .................. 10-2012-0000865

(51) Int. Cl.
| | |
|---|---|
| H02J 7/04 | (2006.01) |
| H02J 7/06 | (2006.01) |
| G01N 27/416 | (2006.01) |
| H02J 7/00 | (2006.01) |
| G01R 31/36 | (2006.01) |

(52) U.S. Cl.
CPC ............. *H02J 7/0052* (2013.01); *G01R 31/361* (2013.01); *G01R 31/3679* (2013.01); *G01R 31/3651* (2013.01)
USPC ........... 320/149; 320/152; 320/157; 320/159; 324/427

(58) Field of Classification Search
CPC .......................... H02J 7/0078; G01R 31/3648
USPC .......................................... 320/149; 324/427
See application file for complete search history.

(56) References Cited

U.S. PATENT DOCUMENTS 6,453,249 B1 9/2002 Shibutani et al.
2008/0103709 A1* 5/2008 Yun et al. .................. 702/63

(Continued)

FOREIGN PATENT DOCUMENTS

JP 2004-170231 A 6/2004
JP 2008-122165 A 5/2008

(Continued)

OTHER PUBLICATIONS

PCT/ISA/210—International Search Report mailed on Sep. 19, 2012, issued in PCT/KR2012/000083.

(Continued)

*Primary Examiner* — Edward Tso
*Assistant Examiner* — Ahmed Omar
(74) *Attorney, Agent, or Firm* — Birch, Stewart, Kolasch & Birch, LLP

(57) ABSTRACT

The present disclosure describes an apparatus and method for estimating state of health (SOH) of a battery. The apparatus for estimating state of health of a battery includes a sensing unit for measuring a battery voltage and current within a predetermined charging voltage range; a memory unit storing the battery voltage and current values measured by the sensing unit and SOH-based ampere counting values, obtained by an ampere counting experiment of a battery whose actual degradation degree is known; and a control unit for calculating an ampere counting value by counting the measured current values stored in the memory unit within the charging voltage range, and estimating a SOH value by mapping the SOH value corresponding to the calculated ampere counting value from the SOH-based ampere counting values stored in the memory unit.

28 Claims, 4 Drawing Sheets

(56) References Cited

U.S. PATENT DOCUMENTS

| | | |
|---|---|---|
| 2010/0036626 A1 | 2/2010 | Kang et al. |
| 2010/0045298 A1* | 2/2010 | Iwane et al. .................. 324/427 |
| 2010/0253145 A1 | 10/2010 | King et al. |
| 2010/0327809 A1 | 12/2010 | Takaoka et al. |

FOREIGN PATENT DOCUMENTS

| | | |
|---|---|---|
| JP | 2008-256642 A | 10/2008 |
| JP | 2010-273523 A | 10/2010 |
| KR | 10-2010-0114123 A | 10/2010 |

OTHER PUBLICATIONS

PCT/ISA/237—mailed on Sep. 19, 2012, issued in PCT/KR2012/000083.

Ng, Kong-Soon et al, "An Enhanced Coulomb Counting Method for Estimating State-of-Charge and State-of-Health of Lead-Acid Batteries," Telecommunications Energy Conference, 2009, Intelec 2009, 31st International IEEE, Oct. 18, 2009, pp. 1-5.

* cited by examiner

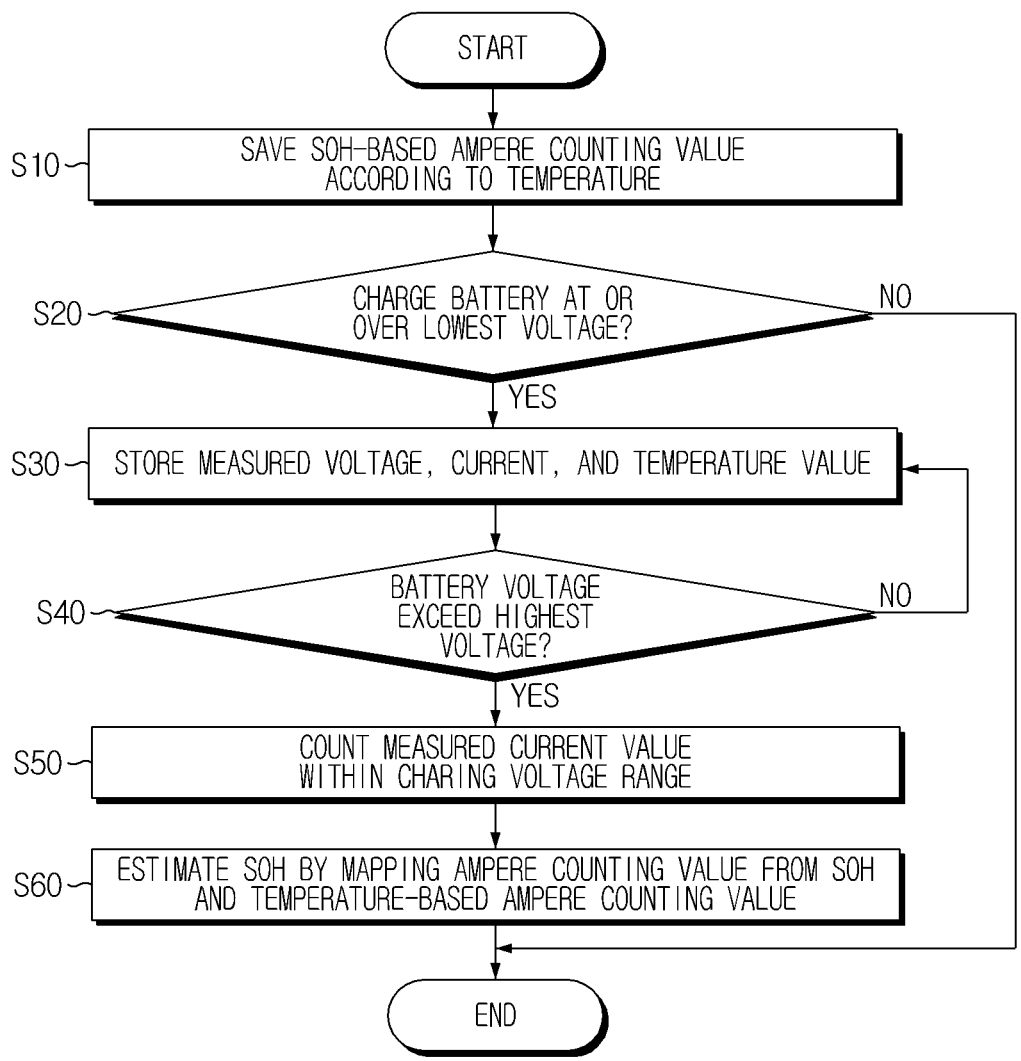

APPARATUS AND METHOD FOR ESTIMATING STATE OF HEALTH OF BATTERY

CROSS-REFERENCE TO RELATED APPLICATION

The present application is a continuation of International Application No. PCT/KR2012/000083 filed on Jan. 4, 2012, which claims priority to Korean Patent Application No. 10-2011-0038545 filed in the Republic of Korea on Apr. 25, 2011 and Korean Patent Application No. 10-2012-0000865 filed in the Republic of Korea on Jan. 4, 2012, the disclosures of which are incorporated herein by reference.

TECHNICAL FIELD

The present disclosure relates to an apparatus and method for estimating state of health (SOH) of a battery, which is a parameter representing capacity degradation of a battery, and more particularly, to an apparatus and method for estimating the SOH of a battery by using SOH-based ampere counting values, obtained by an ampere counting experiment of a battery whose actual degradation degree is known.

BACKGROUND ART

Generally, electric vehicles or hybrid electric vehicles (hereinafter, referred to as electric-driven vehicles) are driven in an electric-driven mode using an electric energy stored in a battery.

The battery used is generally a secondary battery capable of charging and discharging and due to repeated charging and discharging, leads to the degradation of the secondary battery and its performance deterioration. Therefore, when using a secondary battery, a technology for quantitatively evaluating the degree of battery capacity degradation is needed.

State of health (SOH) is a parameter quantitatively representing change of battery capacity characteristics caused by an aging effect and works for showing the degree of battery capacity degradation. Therefore, if SOH is known, a battery can be replaced at a proper time and can be protected from over-charging and over-discharging by controlling battery capacity for charge and discharge based on the battery usage time.

Meanwhile, since the change of battery capacity characteristics is reflected on the change of internal resistance of a battery, SOH of the battery can be estimated from the internal resistance and the battery temperature as well known in the art. In other words, the battery capacity at each internal resistance and each battery temperature is measured through charging and discharging experiments. Then, the measured capacities are expressed as relative numerical values based on an initial capacity of the battery to obtain a look-up table for SOH mapping. After that, internal resistance and battery temperature are measured under an actual use circumstance, and afterwards the SOH corresponding to the measured internal resistance and the temperature is mapped from the look-up table to estimate SOH of the battery.

In the above SOH estimating method, the most important thing is how accurately an internal resistance of a battery can be obtained. However, it is actually impossible to directly measure an internal resistance of a battery during a battery charging or discharging process. Therefore, generally, a battery voltage and a battery charging or discharging current are measured, and then a battery internal resistance is indirectly calculated according to Ohm's law. However, the indirectly calculated battery voltage is significantly different from an actual voltage of a battery due to IR drop effects. In addition, since a battery current are prone to measurement errors, the internal resistance simply calculated according to the Ohm's law and the SOH estimated from the internal resistance do not ensure sufficient reliability.

For reference, the IR drop effect means a phenomenon in which a battery voltage rapidly changes when a battery starts to discharge by connecting to a load or when a battery starts to charge by connecting to an external electric power. In other words, a battery voltage rapidly decreases when discharging is initiated, and a battery voltage rapidly increases when charging is initiated.

As another example of the SOH estimation method, there is a full discharge test, a chemical test and an Ohm test. In the full discharge test, SOH of a battery is estimated by fully discharging a fully charged battery cell and then measuring the capacity of the battery cell. However, this method interrupts the operation of a system connected to the battery and wastes the energy of the battery cell. In the chemical test, SOH of a battery is estimated by measuring corrosion of a substrate and electrolyte concentration of a lead-acid battery. In the Ohm test, SOH of a battery is measured by measuring resistance, conductance, and impedance. However, the aforementioned methods disadvantageously demand an invasive measurement of a battery. Therefore, a noninvasive method, which does not interrupt a connected system and not waste battery energy, is needed for electric-driven vehicles which actually use a secondary battery.

As another example of the SOH estimation method meeting the above requirements, it is also possible to estimate state of charge (SOC) of a battery by charging or discharging currents of the battery, and estimating SOH of the battery by using the estimated SOC. However, in this method, since measurement errors generated in the current measuring progress is continuously accumulated, the accuracy of the SOC used as a basis for estimating SOH of a battery is deteriorated as time goes. Therefore, it is difficult to estimate a reliable SOH of a battery.

As another example of the SOH estimation method, SOH of a battery may also be estimated by using a Kalman filter or an extended Kalman filter. However, since this method uses a complicated mathematical model to estimate SOH of a battery, not only is the calculation procedure too complicated, but a central processing unit with high specification is needed to implement the calculation.

DISCLOSURE

Technical Problem

The present disclosure is designed to solve the problems of the prior art, and therefore it is an object of the present disclosure to provide an apparatus and method for easily estimating state of health (SOH) of a battery with high accuracy.

It is another object of the present disclosure to provide an apparatus and method for estimating SOH of a battery, which may easily estimate SOH of a battery with high accuracy by using SOH-based ampere counting values, obtained from an ampere counting experiment of a battery whose actual degradation degree is known.

It is still another object of the present disclosure to provide an apparatus and method for estimating SOH of a battery, which may improve the accuracy of SOH estimation by estimating an arithmetic average or a weighted average of a plurality of SOH values estimated at different time points as a SOH value at the present time.

Technical Solution

In order to accomplish the above object, an aspect of the present disclosure provides an apparatus for estimating state of health (SOH) of a battery including a sensing unit for measuring a battery voltage and current within a predetermined charging voltage range; a memory unit storing the battery voltage and current values measured by the sensing unit and SOH-based ampere counting values, obtained by an ampere counting experiment of a battery whose actual degradation degree is known; and a control unit for calculating an ampere counting value by counting the measured current values stored in the memory unit within the charging voltage range, and estimating a SOH value by mapping the SOH value corresponding to the calculated ampere counting value from the SOH-based ampere counting values stored in the memory unit.

According to an embodiment of the present disclosure, the control unit may estimate a SOH value by storing the calculated SOH value in the memory unit and averaging the calculated SOH value and previous SOH values stored in the memory unit.

According to another embodiment of the present disclosure, the control unit may estimate a SOH value by storing the calculated SOH value in the memory unit and obtaining a weighted average (a greater weight is endowed as a SOH value is measured earlier) of the calculated SOH value and previous SOH values stored in the memory unit.

In the present disclosure, the charging voltage range may preferably include a voltage range of 3.7 V to 4 V.

Preferably, the control unit may store the estimated SOH value in the memory unit.

In order to accomplish the above object, another aspect of the present disclosure provides an apparatus for estimating state of health (SOH) of a battery, comprising a sensing unit for measuring a battery voltage, current and temperature within a predetermined charging voltage range; a memory unit storing the battery voltage, current and temperature values measured by the sensing unit, and SOH and temperature-based ampere counting values, obtained by an ampere counting experiment according to temperature of a battery whose actual degradation degree is known; and a control unit for calculating an ampere counting value by counting the measured current values stored in the memory unit within the charging voltage range, and estimating a SOH value by mapping the SOH value corresponding to the calculated ampere counting value and a battery temperature, from the SOH and temperature-based ampere counting values stored in the memory unit.

According to the present disclosure, the control unit may estimate a SOH value by storing the calculated SOH value in the memory unit and averaging the calculated SOH value and previous SOH values stored in the memory unit.

In order to accomplish the above object, an aspect of the present disclosure provides a method for estimating the State of Health (SOH) of a battery, including (a) storing SOH-based ampere counting values, obtained by an ampere counting experiment of a battery whose actual degradation degree is known; (b) storing battery voltage and current values, obtained by measuring a battery voltage and current within a predetermined charging voltage range; (c) calculating an ampere counting value by counting the stored current values within the charging voltage range; and (d) estimating a SOH value by mapping the calculated ampere counting value from the stored SOH-based ampere counting values.

In order to accomplish the above object, another aspect of the present disclosure provides a method for estimating the SOH of a battery, including (a) storing SOH and temperature-based ampere counting values, obtained by an ampere counting experiment according to temperature of a battery whose actual degradation degree is known; (b) storing battery voltage, current and temperature values, obtained by measuring a battery voltage, current and temperature within a predetermined charging voltage range; (c) calculating an ampere counting value by counting the stored current values within the charging voltage range; and (d) estimating a SOH value by mapping the calculated ampere counting value and a battery temperature from the stored SOH and temperature-based ampere counting values.

Advantageous Effects

According to the present disclosure, state of health (SOH) of a battery may be estimated without using complicated calculation. Further, by the accurate estimation of SOH of a battery, the present disclosure may be applied to various applications, such as an estimation of battery replacement time. Furthermore, the accurate SOH estimation allows a battery charge or discharge capacity to be controlled based on the degree of battery capacity degradation. Therefore, over-charging or over-discharging may be prevented, and the safety of the battery may be improved.

DESCRIPTION OF DRAWINGS

Other objects and aspects of the present disclosure will become apparent from the following descriptions of the embodiments with reference to the accompanying drawings in which:

FIG. 4 is a schematic flowchart for illustrating a method for estimating SOH of a battery according to another embodiment of the present disclosure.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the spirit and scope of the disclosure.

Figure 1:
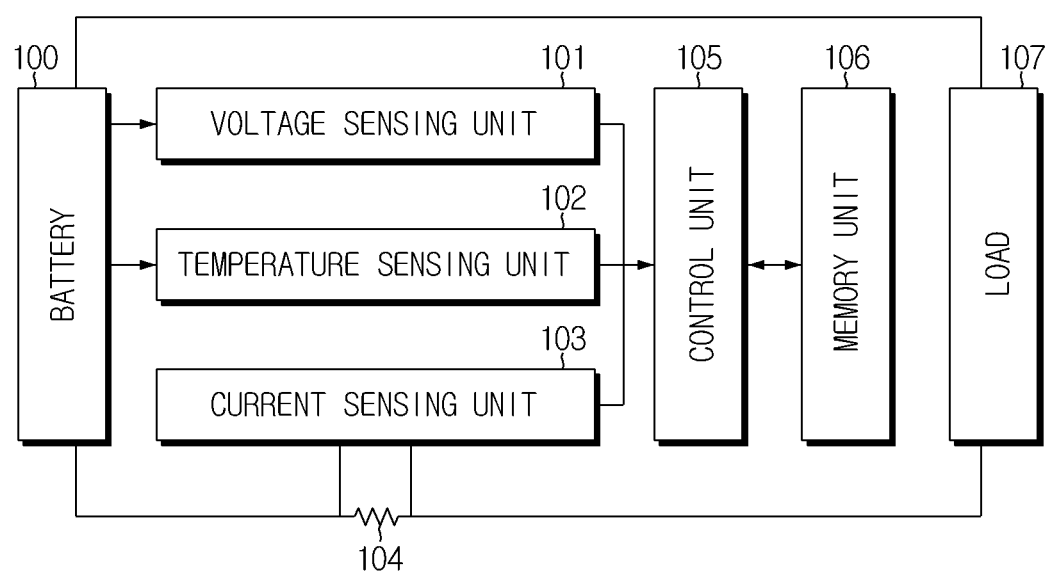
FIG. 1 is a schematic block diagram showing an apparatus for estimating state of health (SOH) of a battery according to an embodiment of the present disclosure.

FIG. 1 is a schematic block diagram showing an apparatus for estimating state of health (SOH) of a battery according to an embodiment of the present disclosure.

Referring to FIG. 1, an apparatus for estimating SOH of a battery according to the present disclosure is connected between a battery 100 and a load 107 and includes a voltage sensing unit 101, a current sensing unit 103, a sense resistor 104, a control unit 105 and a memory unit 106.

The battery 100 includes at least one battery cell and the type of the battery 100 is not specially limited. The battery 100 may adopt lithium ion batteries, lithium polymer batteries, nickel cadmium batteries, nickel hydrogen batteries, nickel zinc batteries, or the like, which are rechargeable and whose charging state should be considered.

The kind of the load 107 is not specially limited, and the load 107 may be portable electronic devices such as video cameras, mobile phones, portable PC (Personal Computer), PMPs and MP3 players, motors of electric vehicles or hybrid vehicles, DC to DC converters, or the like.

The voltage sensing unit 101 periodically measures a battery voltage and outputs the measured voltage value to the control unit 105. The battery voltage is a battery output voltage and is measured while the battery is charged or discharged. The battery voltage value lies between a final discharge voltage value and a maximum charging voltage value.

The current sensing unit 103 measures a current flowing through the sense resistor 104 and outputs the current to the control unit 105. When the battery 100 is charged, a charging current flows at the sense resistor 104, and conversely, when the battery 100 is discharged, a discharging current flows at the sense resistor 104.

The control unit 105 receives the measured battery voltage value, output from the voltage sensing unit 101, and stores the value in the memory unit 106. Also, the control unit 105 receives the measured battery current value, output from the current sensing unit 103, and stores the value in the memory unit 106. The memory unit 106 may be well-known semiconductor devices capable of recording and removing a data, such as RAMs, ROMs, EEPROMs, etc, or large-capacity storage media, such as hard disks, or the like.

Meanwhile, the memory unit 106 stores a SOH mapping table in advance, which allows estimation of a SOH value through mapping. Table 1 below shows an example of the SOH mapping table.

Meanwhile, the charging voltage range is just an embodiment of the present disclosure and does not represent all technical aspects of the present disclosure. Therefore, it should be understood that various charging voltage ranges may be set at the time of filing this application. Also, since the ampere counting manner is well-known in the art, this will not be described in details here.

The control unit 105 calculates an ampere counting value by counting the measured current values of the batteries with reference to the measured voltage and current values stored in the memory unit 106 and stores the calculated ampere counting value in the memory unit 106. Here, the measured current values of the batteries, counted for the calculation of ampere counting value, are preferably limited to those obtained within a predetermined charging voltage range. It is also preferred that the charging voltage range is substantially the same as the voltage range in which currents are counted in the ampere counting experiments, performed for obtaining the SOH mapping table.

Figure 2:
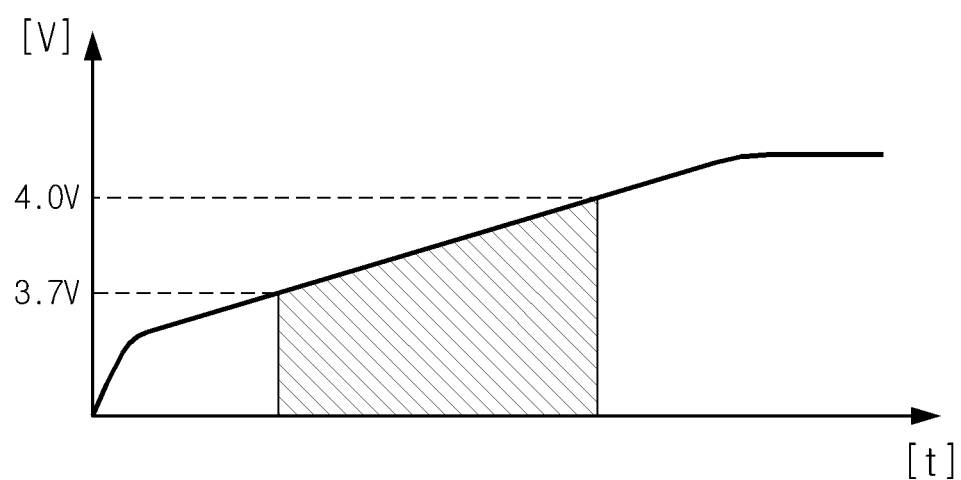
FIG. 2 is a graph showing a profile of counted current values measured within a charging voltage range of 3.7 V to 4 V according to an embodiment of the present disclosure.

FIG. 2 is a graph showing ampere counting values obtained by counting the measured current values within a charging voltage range of 3.7 V to 4.0 V according to the present disclosure.

After the ampere counting value is calculated within the predetermined charging voltage range, the control unit 105 estimates a SOH value by mapping the SOH value corresponding to the calculated ampere counting value from the SOH-based ampere counting values stored in the memory unit 106.

That is, the control unit 105 maps the SOH value corresponding to the ampere counting value calculated within the predetermined charging voltage range with reference to the SOH-based ampere counting values (Table 1) stored in the memory unit 106. In this way, the SOH value of the battery may be easily estimated without complicated calculation.

According to another embodiment of the present disclosure, the control unit 105 may store a SOH value estimated at the present time in the memory unit 106 and estimate the average of the estimated SOH value and previous SOH values stored in the memory unit 106 as a SOH value of the battery. Since a SOH value of a battery does not rapidly change as time goes, if a SOH value of a battery is estimated as the average of previous SOH values and the present SOH value,

TABLE 1

| | Ampere Counting Value | | | | | | | |
|---|---|---|---|---|---|---|---|---|
| | 17.41 mAh | 17.24 mAh | 17.06 mAh | 16.89 mAh | (omitted) | 12.53 mAh | 12.36 mAh | 12.18 mAh |
| SOH | 100% | 99% | 98% | 97% | (omitted) | 72% | 71% | 70% |

The SOH mapping table includes SOH-based ampere counting values. The SOH-based ampere counting values are obtained by performing ampere counting experiments within a predetermined charging voltage range using a plurality of batteries whose SOH values are known. For example, 31 batteries are selected whose SOH values are in the range of 70% to 100% and increase by 1% from 70%. The batteries are fully discharged and then fully charged. While charging the batteries, SOH-based ampere counting values are obtained by performing an ampere counting experiment within a predetermined charging voltage range.

Preferably, the charging voltage range is set as a voltage range in which a battery charging voltage shows a stable variation pattern. For example, the charging voltage range may be set to include a voltage range of 3.7 V to 4.0 V.

any problems caused by rapid SOH value change due to unknown reasons may be solved.

As an example, the control unit 105 may estimate a SOH value by obtaining an arithmetic average of the SOH value estimated at the present time and SOH values estimated in the past according to the following Math Figure 1.

$$\text{AVERAGE } SOH = \frac{SOH_n + SOH_{n-1} + SOH_{n-2} + \ldots SOH_3 + SOH_2 + SOH_1}{n} \quad \text{Math Figure 1}$$

In Math Figure 1, $SOH_n$ represents a SOH value estimated at the present time, and $SOH_{n-1}$ to $SOH_1$ represent SOH values estimated in the past. The number of SOH values, which may be considered in the calculation of an average SOH, may be properly adjusted. In addition, as the number of SOH values estimated in the past increases, robustness against rapid SOH value change increases.

According to still another embodiment of the present disclosure, the control unit 105 estimates a SOH value by obtaining a weighted average of the SOH value estimated at the present time and SOH values estimated in the past according to the following Math Figure 2.

$$\text{WEIGHTED AVERAGE } SOH = \frac{A_n * SOH_n + A_{n-1} * SOH_{n-1} + \ldots + A_2 * SOH_2 + A_1 * SOH_1}{A_{total}} \quad \text{Math Figure 2}$$

$$A_{total} = A_n + A_{n-1} + A_{n-2} + A_{n-3} + A_{n-4} + \ldots + A_2 + A_1$$

In Math Figure 2, $SOH_n$ represents a SOH value estimated at the present time, and $SOH_{n-1}$ to $SOH_1$ represent SOH values estimated in the past. The number of SOH values, which may be considered in the calculation of a weighted average SOH, may be properly adjusted, and as the number of SOH values estimated in the past increases, robustness against rapid SOH value change increases. $A_k$ tends to decrease as k increases. For example, in case of n=100, $A_k$ may have a value decreasing by 1 from 100. As an alternative example, in the Math Figure 2, $A_{n-2}$ to $A_1$ may be set as 0. In this case, $A_k$ also has the same changing tendency as described above. For example, a relatively larger value is endowed to $A_{n-1}$ rather than $A_n$. For example, 10 and 90 may be endowed to $A_n$ and $A_{n-1}$, respectively.

According to still another embodiment of the present disclosure, the control unit 105 may output the estimated SOH value to an external display device. The display device adopts any device which may visually display the estimated SOH value. For example, the display device may include an LCD display, an LED display, or the like.

According to still another embodiment of the present disclosure, the control unit 105 may transmit the estimated SOH value to an external computing device through a network interface. If the battery 100 is mounted in an electric vehicle, the external computing device may be an electric computer loaded in the vehicle or a diagnosis device used for inspecting the vehicle.

Meanwhile, the apparatus for estimating SOH of a battery according to the present disclosure may further include a temperature sensing unit 102 to additionally use a battery temperature to estimate a SOH value of a battery.

The temperature sensing unit 102 periodically measures a battery temperature and outputs the measured temperature values to the control unit 105. Then, the control unit 105 stores the measured temperature values of the battery in the memory unit 106.

If a battery temperature is used for estimating a SOH value, the SOH mapping table stored in the memory unit 106 may be modified as shown in Table 2 below.

TABLE 2

| Battery Temperature: 10° C. | | | | | | | | |
|---|---|---|---|---|---|---|---|---|
| | Ampere Counting Value | | | | | | | |
| | 16.77 mAh | 16.60 mAh | 16.43 mAh | 16.27 mAh | (omitted) | 12.07 mAh | 11.91 mAh | 11.74 mAh |
| SOH | 100% | 99% | 98% | 97% | (omitted) | 72% | 71% | 70% |
| Battery Temperature: 20° C. | | | | | | | | |
| | Ampere Counting Value | | | | | | | |
| | 17.41 mAh | 17.24 mAh | 17.06 mAh | 16.89 mAh | (omitted) | 12.53 mAh | 12.36 mAh | 12.18 mAh |
| SOH | 100% | 99% | 98% | 97% | (omitted) | 72% | 71% | 70% |
| Battery Temperature: 30° C. | | | | | | | | |
| | Ampere Counting Value | | | | | | | |
| | 17.67 mAh | 17.49 mAh | 17.32 mAh | 17.14 mAh | (omitted) | 12.72 mAh | 12.55 mAh | 12.37 mAh |
| SOH | 100% | 99% | 98% | 97% | (omitted) | 72% | 71% | 70% |
| Battery Temperature: 40° C. | | | | | | | | |
| | Ampere Counting Value | | | | | | | |
| | 17.74 mAh | 17.56 mAh | 17.38 mAh | 17.21 mAh | (omitted) | 12.77 mAh | 12.59 mAh | 12.42 mAh |
| SOH | 100% | 99% | 98% | 97% | (omitted) | 72% | 71% | 70% |

As shown in Table 2, the SOH mapping table has a data structure capable of mapping a SOH value according to a battery temperature. Such a SOH mapping table may be obtained by performing the aforementioned ampere counting experiments while varying temperature.

When a SOH value is estimated by using the battery temperature, the control unit 105 may calculate an ampere counting value within the predetermined charging voltage range according to the above method and map the SOH value corresponding to the calculated ampere counting value from the SOH-based ampere counting values corresponding to the measured temperature value of a battery with reference to the SOH look-up table stored in the memory unit 106, thereby estimating a SOH value at the present time. In this case, it is obvious that a SOH value may be estimated as the average of a plurality of SOH values by using Math Figure 1 or 2 above.

Meanwhile, if temperature values of batteries within the charging voltage range in which the ampere counting value is calculated, are irregular, the control unit 105 may calculate an average temperature of the batteries within the charging voltage range and estimate a SOH value by using the average temperature. Since a SOH value of a battery changes depending on the temperature thereof, when a SOH value is estimated in consideration of battery temperature, the SOH of a battery may be estimated more accurately.

The control unit 105 may be configured as a microprocessor capable of executing codes in which the method for estimating SOH of a battery according to the present disclosure is programmed, or as a semiconductor chip in which the control flow of the method for estimating SOH of a battery according to the present disclosure is implemented as a logic circuit, without being limited thereto.

According to the present disclosure as described above, the apparatus for estimating SOH of a battery may be used in combination with a battery pack-driven apparatus which receives electric power from a battery pack.

For example, the apparatus of the present disclosure may be included in various electric products that receive driving-voltage from a battery, such as lap tops, mobile phones, personal portable multimedia players, etc.

As another example, the present disclosure may be used in combination with various power apparatuses having a battery therein, such as fossil-fuel vehicles, electric vehicles, hybrid vehicles, electric bicycles, or the like.

Further, the apparatus for estimating SOH of a battery according to the present disclosure may be included in a battery management system (BMS) which controls charge and discharge of a battery pack and protects the battery pack from over-charge or over-discharge.

Furthermore, the apparatus for estimating SOH of a battery according to the present disclosure may be included in a battery pack.

Now, a method for estimating state of health (SOH) of a battery, which uses the apparatus for estimating SOH of a battery as described above, will be explained in detail.

Figure 3:
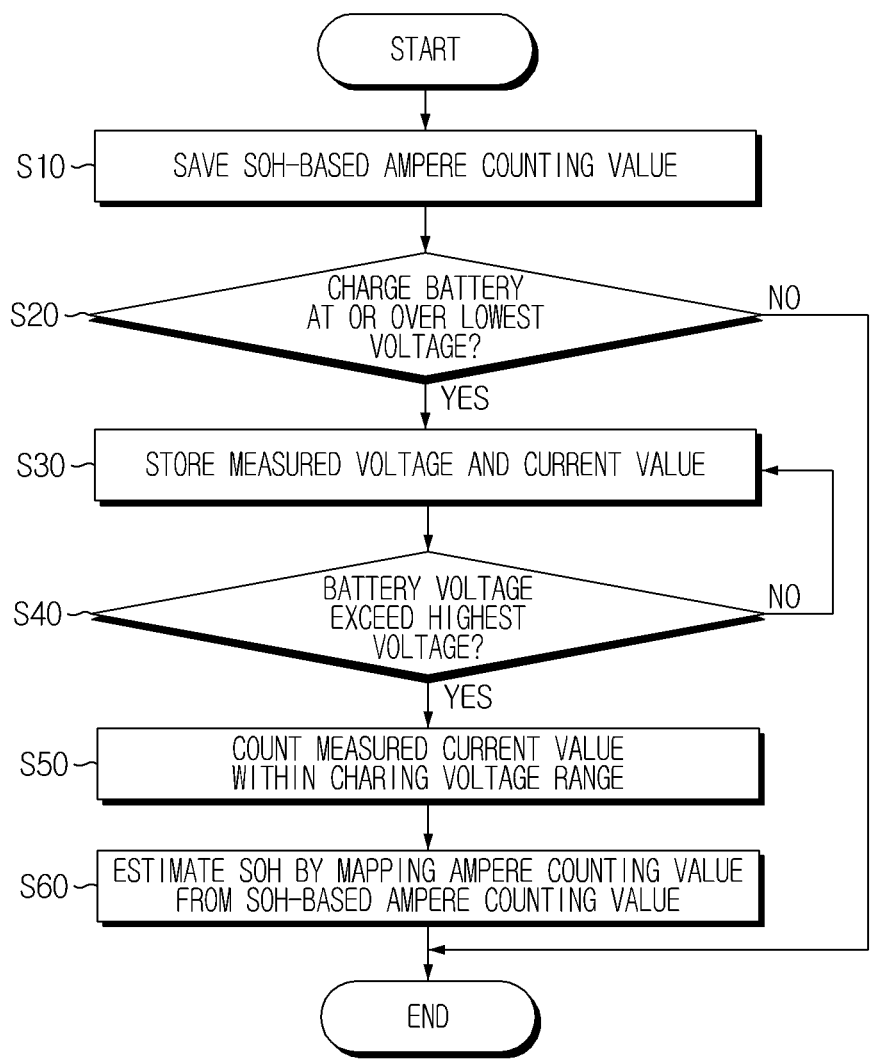
FIG. 3 is a schematic flowchart for illustrating a method for estimating SOH of a battery according to an embodiment of the present disclosure.

FIG. 3 is a schematic flowchart for illustrating a method for estimating SOH of a battery according to an embodiment of the present disclosure. First, the control unit 105 stores SOH-based ampere counting values in the memory unit (S10). Since the method for obtaining the SOH-based ampere counting values and the data structure of the values have been described in detail with reference to Table 1, they will not be described repeatedly. Meanwhile, in the step S10, the control unit 105 may be connected to an interface which may receive the SOH-based ampere counting values. The interface may be a data communication interface, but the present disclosure is not limited thereto.

Next, the control unit 105 determines whether a battery charging mode is activated at or over the lowest voltage of the predetermined charging voltage range (S20). If it is determined that a battery charging mode is activated (YES in S20), the control unit 105 measures a battery voltage and a battery current and stores the measured voltage and current values in the memory unit 106 (S30). However, if it is determined that a battery charging mode is not activated (NO in S20), the control unit 105 ends the process for estimating a SOH value.

Step S30 is preferably repeated periodically while the battery is charged within the predetermined charging voltage range, i.e., a voltage range of 3.7V to 4.0V. For this, after Step S30 is executed, the control unit 105 determines whether the battery charging voltage exceeds the highest voltage of the predetermined charging voltage range (S40).

If the battery voltage does not exceed the highest voltage of the predetermined charging voltage range (NO in S40), the control unit 105 proceeds to Step S30 and stores the measured voltage and current values in the memory unit 106 again.

In contrast, if the battery voltage exceeds the highest voltage of the predetermined charging voltage range, the control unit 105 calculates an ampere counting value by counting the current values measured within the predetermined charging voltage range (S50).

If the ampere counting value is calculated, the control unit 105 maps the SOH value corresponding to the calculated ampere counting value with reference to the SOH-based ampere counting values stored in the memory unit 106, thereby estimating a SOH value of the battery at the present time (S60). For example, if the ampere counting value is 16.89 mAh, a SOH value of the battery is estimated as 97% (see Table 1).

As an alternative of Step S60, the control unit 105 may estimate a SOH value of the battery at the present time as an average of the SOH value estimated at the present time and previous SOH values. Here, since the method for calculating the average has been described above with reference to Math Figures 1 and 2, it will not be described in detail here.

FIG. 4 is a schematic flowchart for illustrating a method for estimating SOH of a battery according to another embodiment of the present disclosure.

According to another embodiment of the present disclosure, the control unit 105 estimates a SOH value of a battery by considering the ampere counting value calculated within the predetermined charging voltage range and the battery temperature together.

For this, the control unit 105 stores temperature and SOH-based ampere counting values in the memory unit 106 (P10). Since the method for obtaining the temperature and SOH-based ampere counting values and the data structure of the values have been described in detail above with reference to Table 2, they will not be described repeatedly.

Next, the control unit 105 performs steps of determining whether a battery charging mode is activated at or over a lowest voltage of the predetermined charging voltage range (P20); measuring battery voltage, current and temperature and storing the measured battery voltage, current and temperature values of the battery in the memory unit 106, if the battery charging mode is activated (P30); determining whether the battery voltage exceeds the highest voltage of the predetermined charging voltage (P40); repeating the process of storing the measured battery voltage, current, and temperature values in the memory unit 106, if the battery charging voltage does not exceed the highest voltage of the predetermined charging voltage (NO in P40); calculating an ampere counting value by counting the stored measured current values within the charging voltage range, if the battery voltage exceeds the highest voltage of the predetermined charging voltage (P50).

Here, Steps P20 to P50 are substantially identical to Steps S20 to S50 except that the measured temperature values of batteries are stored in the memory unit 106.

If the ampere counting value is calculated, the control unit 105 estimates a SOH value of the battery at the present time by mapping the SOH value corresponding to the calculated ampere counting value and the battery temperature with reference to the SOH-based ampere counting values according to temperature stored in the memory unit 106 (P60). For example, if the battery temperature is 20 degree and the ampere counting value is 12.53 mAh, a SOH value is estimated as 72% (see FIG. 2). Meanwhile, when the battery temperature within the charging voltage range is irregular, an average temperature of the measured temperature values, obtained within the charging voltage range, is preferably used as the battery temperature.

As an alternative of Step P60, the control unit 105 may estimate a SOH value of the battery at the present time as an average of the SOH value estimated at the present time and previous SOH values estimated in the past. Herein, since the method for calculating the average has been described with reference to Math Figures 1 and 2, it will not be described repeatedly.

For implementation, the method as described above may be materialized as a process or a device made by using a computer. Also, the above method may be implemented by storing computer program codes in floppy diskettes, CD-ROMs, hard disk, or any type of computer-readable storage devices. At this time, the computer becomes a device for performing the above method by reading and executing the computer program codes stored in the above-mentioned storage devices. Also, the above method may be implemented as a form of stored data, read and executed by a computer, or data signals transmitted through conductive wires, cables, optical fibers, electromagnetic waves, or the like. At this time, the computer becomes a device for performing the above method by receiving, reading and executing the stored data or the data signals.

Experimental Example

Hereinafter, effects of the present disclosure will be explained based on the following experimental example. However, the following experimental example is just for illustrating the present disclosure and not intended to limit the scope of the invention.

First, the experiment was performed by using a lithium secondary battery having a capacity of 43 Ah and SOH of 100%. After a fully-discharged lithium secondary battery is connected to a charging device, the lithium secondary battery was placed in a chamber which keeps the lithium secondary battery at room temperature. After that, the battery was charged with a constant voltage. In this process, a charging current of the battery was measured from when the battery voltage was 3V until the battery voltages reached 4V. The measured current values were counted and a counted current value was calculated within the voltage range. As a result of the calculation, the battery was charged with 26.88091 Ah during 4501 seconds.

Next, the same experiment as above was performed with batteries respectively exhibiting SOH of 98%, 97%, 77% and 72%. As a result, the battery with SOH of 98% was charged with 26.34897 Ah during 4441 seconds, the battery with SOH of 97% was charged with 26.22061 Ah during 4416 seconds, the battery with SOH of 77% was charged with 20.94577 Ah during 3504 seconds, and the battery with SOH of 72% was charged with 19.12639 Ah during 3201 seconds.

Table 3 below compares actual experiment data with the expected ampere counting values calculated according to SOH based on the result of the above-mentioned experiment. In the calculation of the expected ampere counting current values, first, 26.88091 Ah, an ampere counting value of a battery having SOH of 100%, is set as a reference value among the above experimental data. In addition, the reference value is multiplied by each of actual SOHs to calculate an ampere counting value expected according to the corresponding SOH. Such a calculation method assumes that an ampere counting value decreases at a constant ratio according to SOH within the above-mentioned voltage range.

TABLE 3

| Actual SOH | Actual Ampere Counting Value(Ah) | Ampere Counting Value Calculated according to SOH (=Reference Value × SOH) | Error of Ampere Counting Value |
|---|---|---|---|
| 100% | 26.88091(Ah) (Reference Value) | — | — |
| 98% | 26.34897(Ah) | 26.34329(Ah) | −0.00568(Ah) |
| 97% | 26.22061(Ah) | 26.07448(Ah) | −0.14613(Ah) |
| 77% | 20.94577(Ah) | 20.69830(Ah) | −0.24747(Ah) |
| 72% | 19.12639(Ah) | 19.35425(Ah) | +0.22789(Ah) |

As shown in Table 3, it may be found that the ampere counting values calculated according to the reference value are different from the actual ampere counting value. Particularly, it may be found that the batteries having SOH of 98% and 97% have relatively small errors, but the batteries having SOH of 77%, 72% have much greater errors. Since a battery capacity does not decrease at a constant ratio according to the degradation of a battery in all voltage ranges, the above errors are generated. Also, it may be found that the errors increase when SOH decreases.

Therefore, it would be understood that the errors can be reduced by using an ampere counting value obtained by an actual experiment as a basis to estimate the SOH of a battery, instead of using the ampere counting value obtained by simple ratio calculation.

Also, Table 4 below comparatively shows an actual SOH and the SOH estimated according to a simple ratio of the reference value to an actual ampere counting value. In the SOH estimation according to a simple ratio, the actual counting value is divided by the reference value and then the ratio is estimated as the SOH.

TABLE 4

| Actual SOH | Actual Ampere Counting Value(Ah) | Estimated SOH (Ampere Counting Value/Reference Value × 100) | Error of SOH |
|---|---|---|---|
| 100% | 26.88091(Ah) (Reference Value) | — | — |
| 98% | 26.34897(Ah) | 98.021% | +0.021% |
| 97% | 26.22061(Ah) | 97.544% | +0.544% |
| 77% | 20.94577(Ah) | 77.921% | +0.921% |
| 72% | 19.12639(Ah) | 71.152% | +0.152% |

As shown in Table 4 above, it may be found that when SOH is estimated according to the simple ratio of the ampere counting value, there is an error between the SOH and the actual SOH. In addition, error will start to accumulate, the more the number of times a battery is charged or discharged, and so, the estimated SOH value will have a much greater error at the end. Therefore, it would be understood that if SOH of a battery is estimated by using the actual ampere counting value, the SOH may be estimated more accurately.

From the above experimental example, it would be understood that if the SOH of a battery is estimated by using SOH-based ampere counting values obtained by an ampere counting experiment of a battery whose actual degradation degree is known, the SOH of a battery may be easily estimated, and the accuracy of the estimated SOH may also be improved.

According to the present disclosure as described above, unlike the conventional technology, a complicated calculation is not needed to estimate capacity degradation of a battery. Further, since the estimation of capacity degradation of a battery using actual experiment data has high reliability, the estimated capacity degradation may be applied to various types of applications, such as estimation of battery replacement time. Furthermore, since over-charging or over-discharging is prevented by controlling a charging or discharging capacity of a battery according to the battery capacity degradation, the safety of a battery may be further improved.

Meanwhile, each component of the apparatus for estimating the SOH of a battery of the present disclosure shown in FIG. 1 should be understood as a logic component, rather than a physically distinguishable component.

In other words, each component corresponds to an element logically distinguished for realizing the spirit of the present disclosure. Therefore, each component should be understood as being included in the scope of the present disclosure if it may realize its logic function though it is separately implemented or integrated with another component. In addition, components realizing their same or similar function should be understood as being included in the scope of the present disclosure even though their designations are different.

INDUSTRIAL APPLICABILITY

The present disclosure has been described in detail. However, it should be understood that the detailed description and specific examples, while indicating preferred embodiments of the disclosure, are given by way of illustration only, since various changes and modifications within the spirit and scope of the disclosure will become apparent to those skilled in the art from this detailed description.

What is claimed is:

1. An apparatus for estimating state of health (SOH) of a battery, comprising:
    a sensing unit for measuring a battery voltage and current within a predetermined charging voltage range;
    a memory unit storing the battery voltage and current values measured by the sensing unit and SOH-based ampere counting values, obtained by an ampere counting experiment of a battery whose actual degradation degree is known; and
    a control unit for calculating an ampere counting value by counting the measured current values stored in the memory unit within the charging voltage range, and estimating a SOH value by mapping the SOH value corresponding to the calculated ampere counting value from the SOH-based ampere counting values stored in the memory unit.

2. The apparatus for estimating SOH of a battery according to claim 1, wherein the control unit estimates a SOH value by storing the calculated SOH value in the memory unit and averaging the calculated SOH value and previous SOH values stored in the memory unit.

3. The apparatus for estimating SOH of a battery according to claim 1, wherein the control unit estimates a SOH value by storing the calculated SOH value in the memory unit and obtaining a weighted average (a greater weight is endowed as a SOH value is measured earlier) of the calculated SOH value and previous SOH values stored in the memory unit.

4. The apparatus for estimating SOH of a battery according to claim 1, wherein the charging voltage range includes a voltage range of 3.7 V to 4 V.

5. The apparatus for estimating SOH of a battery according to claim 1, wherein the control unit stores the estimated SOH value in the memory unit.

6. The apparatus for estimating SOH of a battery according to claim 5, wherein the control unit outputs the estimated SOH value stored in the memory unit to a display device.

7. A battery pack, comprising the apparatus for estimating SOH of a battery according to claim 1.

8. A battery-driven apparatus, comprising the apparatus for estimating SOH of a battery according to claim 1.

9. An apparatus for estimating state of health (SOH) of a battery, comprising:
    a sensing unit for measuring a battery voltage, current and temperature within a predetermined charging voltage range;
    a memory unit storing the battery voltage, current and temperature values measured by the sensing unit, and SOH and temperature-based ampere counting values, obtained by an ampere counting experiment according to temperature of a battery whose actual degradation degree is known; and
    a control unit for calculating an ampere counting value by counting the measured current values stored in the memory unit within the charging voltage range, and estimating a SOH value by mapping the SOH value corresponding to the calculated ampere counting value and a battery temperature, from the SOH and temperature-based ampere counting values stored in the memory unit.

10. The apparatus for estimating SOH of a battery according to claim 9, wherein the control unit estimates a SOH value by storing the calculated SOH value in the memory unit and averaging the calculated SOH value and previous SOH values stored in the memory unit.

11. The apparatus for estimating SOH of a battery according to claim 9, wherein the control unit estimates a SOH value by storing the calculated SOH value in the memory unit and obtaining a weighted average (a greater weight is endowed as a SOH value is measured earlier) of the calculated SOH value and previous SOH values stored in the memory unit.

12. The apparatus for estimating SOH of a battery according to claim 9, wherein the charging voltage range includes a voltage range of 3.7 V to 4 V.

13. The apparatus for estimating SOH of a battery according to claim 9, wherein the control unit stores the estimated SOH value in the memory unit.

14. The apparatus for estimating SOH of a battery according to claim 13, wherein the control unit estimates a SOH value by calculating an average temperature of the temperatures measured within the charging voltage range and mapping the SOH value corresponding to the ampere counting value and the average temperature from the SOH and temperature-based ampere counting values stored in the memory unit.

15. A battery pack, comprising the apparatus for estimating SOH of a battery according to claim 9.

16. A battery-driven apparatus, comprising the apparatus for estimating SOH of a battery according to claim 9.

17. A method for estimating state of health (SOH) of a battery, comprising:
    (a) storing SOH-based ampere counting values, obtained by an ampere counting experiment of a battery whose actual degradation degree is known;
    (b) storing battery voltage and current values, obtained by measuring a battery voltage and current within a predetermined charging voltage range;

(c) calculating an ampere counting value by counting the stored current values within the charging voltage range; and (d) estimating a SOH value by mapping the calculated ampere counting value from the stored SOH-based ampere counting values.

18. The method for estimating SOH of a battery according to claim 17, wherein the step (d) further includes:
    saving the estimated SOH value; and
    estimating a SOH value by averaging the calculated SOH value and previous SOH values stored in the memory unit.

19. The method for estimating SOH of a battery according to claim 17, wherein the step (d) further includes:
    storing the calculated SOH value; and
    estimating a SOH value by obtaining a weighted average (a greater weight is endowed as a SOH value is measured earlier) of the calculated SOH value and previous SOH values stored in the memory unit.

20. The method for estimating SOH of a battery according to claim 17, wherein the charging voltage range includes a voltage range of 3.7 V to 4 V.

21. The method for estimating SOH of a battery according to claim 17, further comprising: storing the estimated SOH value.

22. The method for estimating SOH of a battery according to claim 21, further including: outputting the stored SOH value to a display device.

23. A method for estimating the SOH of a battery, comprising:
    (a) storing SOH and temperature-based ampere counting values, obtained by an ampere counting experiment according to temperature of a battery whose actual degradation degree is known;
    (b) storing battery voltage, current and temperature values, obtained by measuring a battery voltage, current and temperature within a predetermined charging voltage range;
    (c) calculating an ampere counting value by counting the stored current values within the charging voltage range; and
    (d) estimating a SOH value by mapping the calculated ampere counting value and a battery temperature from the stored SOH and temperature-based ampere counting values.

24. The method for estimating SOH of a battery according to claim 23, wherein the step (d) further includes:
    saving the estimated SOH value; and
    estimating a SOH value by averaging the calculated SOH value and previous SOH values stored in the memory unit.

25. The method for estimating SOH of a battery according to claim 23, wherein the step (d) further includes:
    storing the calculated SOH value; and
    estimating a SOH value by obtaining a weighted average (a greater weight is endowed as a SOH value is measured earlier) of the calculated SOH value and previous SOH values stored in the memory unit.

26. The method for estimating SOH of a battery according to claim 23, wherein the charging voltage range includes a voltage range of 3.7 V to 4 V.

27. The method for estimating SOH of a battery according to claim 23, further comprising: storing the estimated SOH value.

28. The method for estimating SOH of a battery according to claim 23, wherein the step (d) further includes:
    calculating an average temperature of the temperature values measured within the charging voltage range; and
    estimating a SOH value by mapping the average temperature and the ampere counting value from the SOH and temperature-based ampere counting values.

* * * * *